United States Patent
Rankin et al.

(10) Patent No.: US 7,211,356 B2
(45) Date of Patent: May 1, 2007

(54) METHOD OF PATTERNING A SUBSTRATE BY FEEDING MASK DEFECT DATA FORWARD FOR SUBSEQUENT CORRECTION

(75) Inventors: Jed H. Rankin, South Burlington, VT (US); Andrew J. Watts, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/275,178

(22) Filed: Dec. 16, 2005

(65) Prior Publication Data

US 2006/0068302 A1    Mar. 30, 2006

(51) Int. Cl.
*G03C 5/00* (2006.01)

(52) U.S. Cl. ............................ 430/30; 430/5; 430/311; 430/312

(58) Field of Classification Search .................... 430/5, 430/30, 311, 312
See application file for complete search history.

*Primary Examiner*—Christopher G. Young
(74) *Attorney, Agent, or Firm*—Richard M. Kotulak

(57) ABSTRACT

A method is provided for patterning a substrate. In such method a first mask, for example, a front-end-of-line ("FEOL") mask is fabricated, the first mask including a plurality of first features such as FEOL features which are usable to pattern regular elements and redundancy elements of a substrate such as a microelectronic substrate and/or a micro-electromechanical substrate. The first mask is tested, i.e., inspected for defects in the features. Thereafter, a second sequentially used mask, for example, a back-end-of-line ("BEOL") mask is fabricated which includes a plurality of second features, e.g., BEOL features, such features being usable to pattern a plurality of interconnections between individual ones of the regular elements and between the regular elements and the redundancy elements. The regular elements and the redundancy elements are patterned using the first mask and the interconnections between them are patterned using the second mask. As a result, the interconnections are patterned in a way that corrects for the detected defects in the first mask.

18 Claims, 4 Drawing Sheets

US 7,211,356 B2

METHOD OF PATTERNING A SUBSTRATE BY FEEDING MASK DEFECT DATA FORWARD FOR SUBSEQUENT CORRECTION

BACKGROUND OF THE INVENTION

The present invention relates to the fabrication of microelectronic and micro-electromechanical devices.

Photomasks used in the fabrication of microelectronic and micro-electromechanical devices, e.g., integrated circuits ("chips"), wafers, and substrates used to interconnect chips typically are required to be free of defects. In photomasks ("masks") used to pattern features of microelectronic substrates (e.g., transistors, micro-electromechanical ("MEMS") devices, and other small devices), it is becoming increasingly difficult to meet this requirement. The costs and amount of time required to fabricate a mask, as well as the number of masks in a set of masks are increasing dramatically, particularly in advanced semiconductor technologies. The layouts to be patterned by a mask are becoming increasingly complex, containing ever greater numbers of features, while the sizes of such features (e.g., the widths and lengths of lines) shrink with a ground rule that is reduced with succeeding generations of technology.

Unfortunately, it is increasingly difficult to produce photomasks to the requirements of increased complexity and reduced ground rule, such that many photomasks are defective as fabricated. Current practice requires that defective photomasks either be repaired or replaced with photomasks which do not have defects. However, since the repair of masks and the manufacture of new masks require expenditures of both time and money, efforts to address such defects can be costly at the introduction of a new product and can even sometimes hinder its entry into the market.

SUMMARY OF THE INVENTION

A method is provided for patterning a substrate. In such method a first mask is fabricated, the first mask including a plurality of first features which are usable to pattern regular elements and redundancy elements of a substrate such as a microelectronic substrate and/or a micro-electromechanical substrate. The first mask is tested, i.e., inspected for defects in the first features of the mask. Thereafter, a sequentially subsequent second mask is fabricated which includes a plurality of second features. In one example, the second features of the second mask are usable to pattern a plurality of interconnections between individual ones of the regular elements and between the regular elements and the redundancy elements. The regular elements and the redundancy elements are patterned using the first mask and the interconnections between them are patterned using the second mask. As a result, the patterns of the second mask are defined in a way that corrects for the detected defects in the first mask.

In a preferred embodiment, the first mask is an FEOL mask which includes a plurality of FEOL features and the second mask is a BEOL mask which includes a plurality of BEOL features. In such case, the patterns of the BEOL mask are defined in a way that corrects for the detected defects in the FEOL mask.

DETAILED DESCRIPTION

Figure 1:
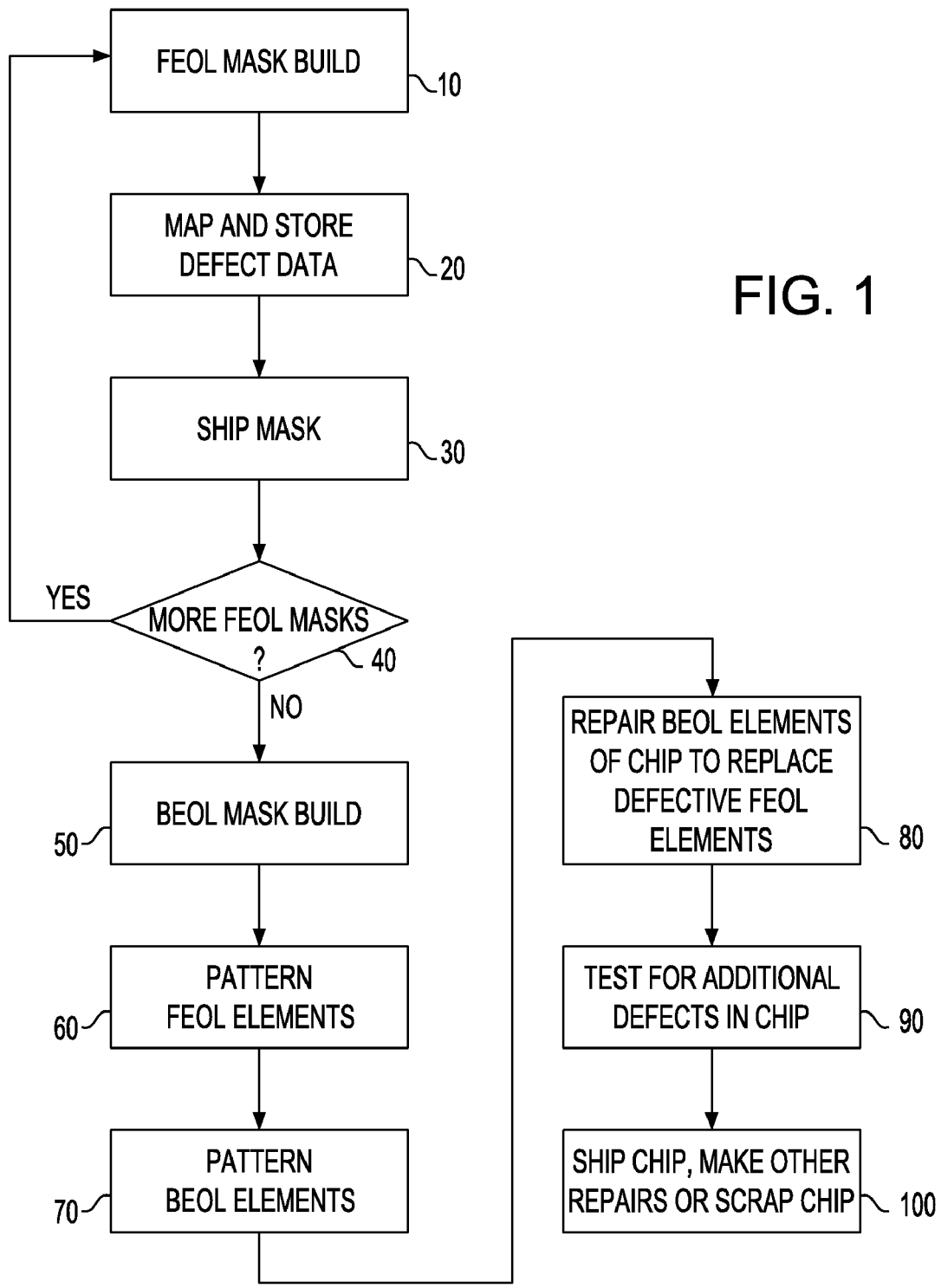
FIG. 1 is a diagram illustrating a method of patterning a substrate in accordance with a first embodiment of the invention.

In view of the difficulties of fabricating masks which are free of defects, a way is provided according to an embodiment of the invention to pattern features of a microelectronic or micro-electromechanical substrate, for example, a chip, integrated circuit or wafer, without requiring masks to be free of defects. Particularly when one mask of a sequential series of masks is found to have a defect, a way is provided to pattern features of a substrate using the defective mask and one or more subsequent sequential masks in the series so as to produce a fully functional substrate which is free of defects.

For example, in one embodiment, a first mask is checked after fabrication to detect features that are defective. If the mask has no defects, it will be employed as usual to pattern the features of the substrate. However, when the mask is defective, it is not automatically scrapped, as it would be in a conventional process. Instead, the mask will still be used to pattern features of the substrate and an action is applied at a point in the fabrication process of the substrate to correct for the defect in the mask.

A sizable proportion of integrated circuits and devices are manufactured as "application-specific" devices, e.g., as application-specific integrated circuits ("ASICs"), which are sometimes custom-made or are tailored to specific uses or needs of a group or class of customers. Certain ASICs are designed via a "gate array" concept, by interconnecting arrays of reusable circuit elements or "cells" in a way to fulfill a specific function or purpose needed by a customer. Frequently, the entire function of the chip is implemented by interconnecting a few limited types of circuit elements. Each such reusable circuit element contains, for example, one to a few active devices, i.e., transistors, diodes and the like. In the case of micro-electromechanical substrates, each reusable circuit element includes one to a few micro-electromechanical devices. Cells of a front-end-of-line ("FEOL") device array or other recurring "FEOL elements" are normally patterned by features of an FEOL mask. The function of the ASIC is further implemented with BEOL elements which interconnect ones of the recurring FEOL cells together in a specific way. While a substantial proportion of the available FEOL cells are used to serve the purpose of the ASIC, a substantial proportion of the FEOL cells remains available and unused in the chip.

One of the things which make it possible to use the defective mask is a chip design which includes a number of redundancy circuit elements or "redundancy cells" on a chip. These redundancy cells are available for use when regularly used circuit elements ("regular elements") are defective. Another prerequisite for using a defective mask is the ability to determine which elements are defective. A final requirement is having a way of changing the interconnections to the regular elements and the redundancy elements so that the redundancy elements take the place of, i.e., "replace" the defective regular elements.

In an ASIC, certain circuit elements of the chip function as the "regular elements". The regular elements are normally used and interconnected to serve the function of the ASIC. The normally unused circuit elements of the chip include circuit elements which are identical to those normally used. These circuit elements can be made to function as redundancy elements of the ASIC for replacing the regular elements when the regular elements are not repairable.

A process of patterning a chip according to an embodiment of the invention will now be described with reference to the flow diagram of FIG. 1. In such process, a microelectronic chip or micro-electromechanical chip is patterned while the chip remains attached to other chips of a wafer. The process illustrated in FIG. 1 is described with reference to patterning a substrate using one or more FEOL masks and subsequently using one or more BEOL masks. However, the principles and operations illustrated therein are also applicable to initially patterning a substrate using one or more masks and thereafter using any sequentially subsequent mask to continue patterning the substrate thereafter. FIG. 1 illustrates an embodiment in which defects in first circuit elements, for example, defects in front-end-of-line (FEOL) circuit elements, have already been identified by checking the mask itself. Such checking is performed to identify defects in the first features of a first mask, e.g., an FEOL mask, i.e., to identify "defective FEOL mask features" prior to patterning circuit elements in FEOL processing. For that reason, repairs to such defects can be made at any time after photolithographic processing. Such repairs can be performed any time after photolithographically patterning the substrate using the FEOL and BEOL masks, and without needing to check the microelectronic substrate again after such patterning to identify defects in the substrate. In a particular embodiment, the repairs are performed using defect data gained from the testing done with respect to the FEOL mask, without first testing the chip itself after photolithographic processing.

In such embodiment, repairs are performed by permanently making or breaking electrical connections between a set of circuit elements. For example, individual fuses and/or antifuses from a bank of such elements can be blown to change connections between FEOL features or BEOL features of the microelectronic substrate. The fuses or antifuses are blown through localized heating while the chip remains attached to other identical or similar chips in form of a wafer or portion of a wafer. Such localized heating can be accomplished, for example, by applying a high current to the fuse or antifuse or by focused light from a laser. When fuses are blown, their conductivity changes from a "closed circuit" or more conductive state to an "open circuit" state, i.e., one that is much less conductive state than the closed circuit state. When antifuses are blown, their conductivity changes from an "open circuit" state to a "closed circuit" state by applying either thermal or electrical energy to a deliberately "weak" electronic insulator element.

In a first step (10) of the process denoted "FEOL mask build", an FEOL mask is fabricated, such mask being used to pattern FEOL features of the chip. The mask is fabricated after steps are performed to design and correct the mask, e.g., based on rules or optical proximity, as are usually done in making a mask. Fabrication of the mask includes a process of forming, e.g., writing the features of the mask onto a sheet of quartz or other transparent material, e.g., as by inscribing features into a layer of chrome or other metal on a surface of a quartz sheet. In some cases, additional optical phase-shifting features are created by reducing a thickness of the quartz sheet in defined areas.

Thereafter, in block 20, the mask is tested to determine whether any defects are present. This step is preferably performed by optically inspecting the mask to obtain mask inspection data. Thereafter, the mask inspection data are processed to identify any defects in the mask. This processing step preferably includes using the mask inspection data to identify defective features of the FEOL mask and mapping their locations, i.e., recording their locations in relation to the FEOL elements that they produce on the wafer. In that way, the defective FEOL mask features can be corrected via one or more subsequent processes. A set of defect data identifying the mask defects is stored for the mask.

The defect data are sufficiently precise to enable one or more repair processes to be performed to the chip that will be produced later by patterning a wafer using the FEOL mask. In one embodiment, the defect data precisely identifies each cell of the FEOL device array that is expected to be defective due to the defective features of the FEOL mask. In another embodiment, the defect data can be more precise or less precise. For example, the defect data may only identify a group of cells (e.g., two or more cells) of the FEOL device array to be repaired. Alternatively, the defect data may contain sufficient precision to identify expected defects in smaller units of the chip, e.g., in individual polysilicon lines or first metal level lines of the FEOL device array of a chip.

A particular embodiment of the invention operates on a principle of correcting for defective FEOL elements of the chip which result from use of the FEOL mask having the defective mask features. In such process, interconnections, fuses, or anti-fuses between elements of the chip are modified to compensate for the defective FEOL mask features. The chip also includes wiring, typically in form of BEOL interconnections which overlie a level in which the FEOL elements are provided. In such embodiment, data relating to the defective FEOL mask features are input to a process later used to repair, i.e., correct for defective FEOL elements of the substrate. Thus, in such embodiment, data regarding defects of the mask obtained by analyzing the mask inspection data, are used later in block 80 later to modify the substrate, e.g., a chip.

After storing the defect data, in block 30 the mask is shipped, i.e., released for use in manufacturing chips. Manufacturing will proceed at a later time as further described below. At block 40, it is determined whether any other FEOL masks remain to be fabricated. The fabrication of a chip involves photolithographic processing using several FEOL masks which may have differing degrees of precision as, for example, a "deep UV" mask for use with a short wavelength ultraviolet source, and a "mid-UV" mask for use with a somewhat longer wavelength source. Thus, the steps 10, 20 and 30 preferably are performed with respect to every one of such FEOL masks used to pattern the chip. Defects in each such FEOL mask are mapped and defect data are preferably stored for each such mask for use in correcting for such defects at a later stage of fabrication.

In block 50, one or more back-end-of-line ("BEOL") masks are built; i.e., fabricated, such as in a conventional manner from a data representation thereof. In the embodiment illustrated in FIG. 1, the fabrication of the BEOL mask does not depend upon the outcome of fabricating the one or more FEOL masks. Correction for defects in the one or more FEOL masks is made by repairs performed to features of the chip during or after the fabrication of the chip. Therefore, the fabrication of the BEOL mask can precede or follow the fabrication of the one or more FEOL masks, or the BEOL can be fabricated by processing performed in parallel with the processing of the FEOL mask.

In step 60 the FEOL elements of a chip, e.g., semiconductor structures, transistors, etc., are patterned using the FEOL mask and in step 70 the BEOL elements of the chip are patterned using the BEOL mask. Thereafter, in block 80 repairs (or design modifications) are made to the chip after photolithographically patterning the FEOL elements and BEOL elements. Repairs are made, for example, by altering some of the BEOL elements by blowing fuses, antifuses and/or combinations of fuses and antifuses. The effect of the repairs is to re-route signals and/or currents and/or voltages from defective FEOL elements to corresponding redundancy FEOL elements of the chip. Defective FEOL elements of the chip, such as defective FEOL cells, are thus "replaced" by corresponding redundancy FEOL elements of the chip by altering the BEOL elements of the chip after the BEOL elements have been patterned on the chip.

Optionally, the BEOL elements of the chip are altered in block 80 based on the defect data obtained in block 20 concerning the FEOL mask before the chip is tested to determine whether other defects are present. In such way, defects identified by prior analysis of the mask inspection data are repaired without needing to first test the chip following its manufacture. Moreover, some mask defects may lead to defects in the chip which severely affect the function of the chip and possibly its testability. Making such repairs before testing basic functionality of the chip can place an otherwise non-testable, non-repairable chip in a usable (and testable) form.

After making such repairs to the chip, in block 90 the chip undergoes post-fabrication tests, i.e., electrical tests, to determine whether other defects are present. In block 100 when the chip is determined after that testing to have no defects, the chip is shipped, i.e., passed to a later stage of production for packaging and incorporation into an electronic system. Otherwise, if the chip is determined to have defects which are repairable, those defects are then repaired. However, when the chip is defective to an extent that it is not repairable, the chip is scrapped.

In a variation of the above embodiment, repairs to correct defective elements of the chip are made only at the time of conducting regular post-fabrication tests, rather than doing them before the regular post-fabrication tests to correct for mask defects and again after testing to correct for defects identified during the testing. In that way, post-fabrication testing and post-fabrication repairs are performed in the usual sequence.

Figure 2:
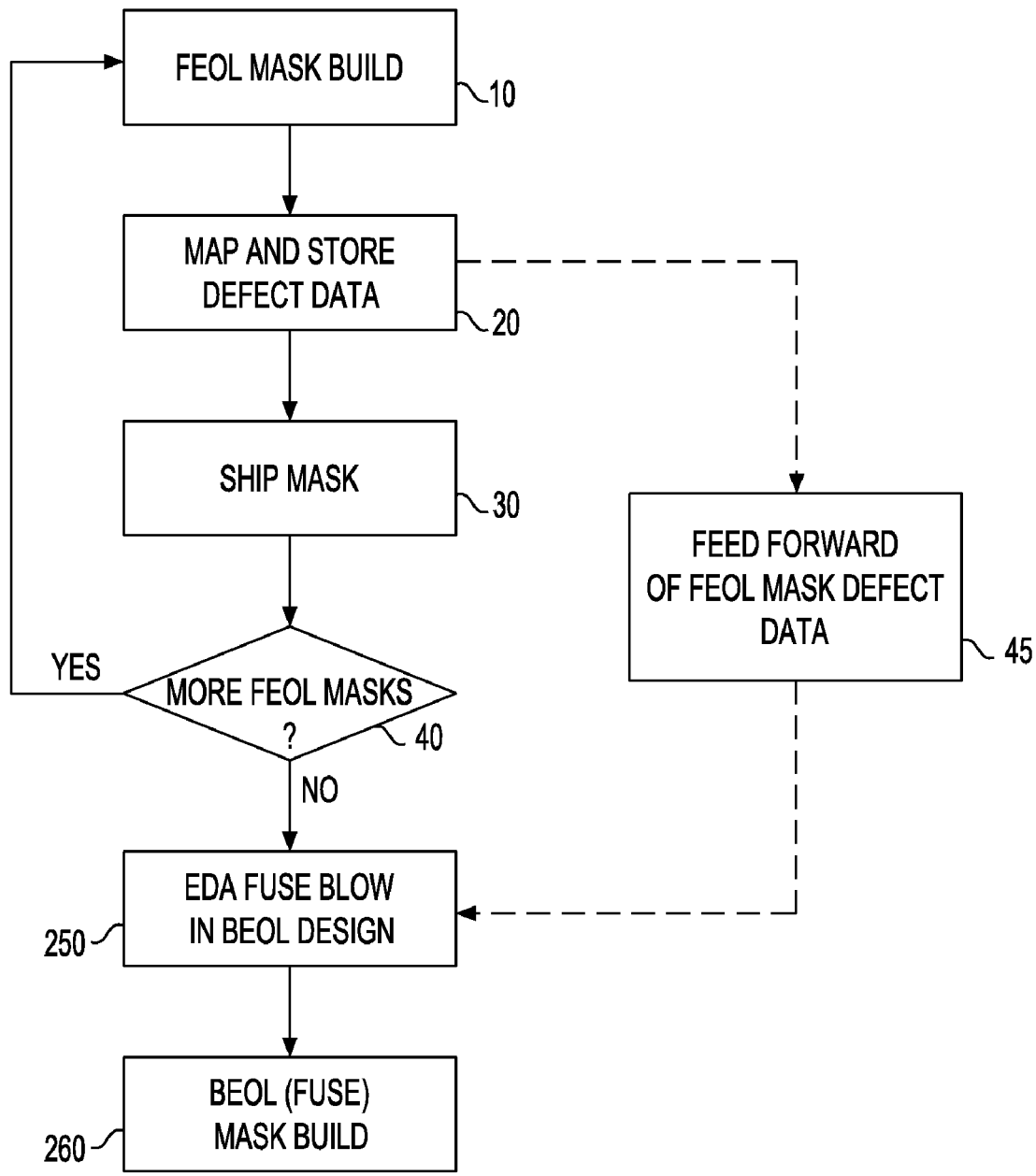
FIG. 2 is a diagram illustrating a method of fabricating of set of masks in a method of patterning a substrate in accordance with a second embodiment of the invention.

FIG. 2 is a flow diagram illustrating a method of generating a set of photomasks for lithographically patterning a chip in accordance with another embodiment of the invention. In this embodiment, the method results in a set of corrected masks usable to fabricate a chip which will be inherently perfectly functional. In this embodiment, the method is similar to that illustrated in FIG. 1 in that the actions performed according to the first four blocks 10, 20, 30 and 40 are the same. Again, the process illustrated in FIG. 2 will be described with reference to patterning a substrate using an FEOL mask and a BEOL mask, with the understanding that the principles and operations illustrated therein can be applied to patterning a substrate initially using one or more masks and thereafter using a sequentially subsequent mask to continue patterning the substrate thereafter. In this embodiment, instead of using data identifying the mask defects to effect post-fabrication repairs, in block 45 data regarding the defects in a first mask (FEOL mask defects) are fed forward, i.e., provided as input to a late-stage design process 250 of a sequentially subsequent mask, e.g., a BEOL mask. In the specific example illustrated in FIG. 2, using the FEOL mask defect data, the design of one or more BEOL masks is altered in a way that corrects for the FEOL mask defects.

In this embodiment, certain discrete features of the BEOL mask are severable or removable from other features of the BEOL mask. That is, individual, discrete features of the BEOL mask are capable of being readily severed or removed to disconnect particular features from other features of the BEOL mask. In an example of use, assume that a defect is identified in a portion of the FEOL mask used to pattern a circuit block, i.e., a block of circuit elements or entire circuits. Referring to block 250, one or more features in the BEOL mask are identified and then deleted, severed or otherwise altered to correct for the defect in the FEOL mask. For example, when the defect in the FEOL mask would render a particular circuit block of the completed chip defective, the deletion or severing of the feature of the BEOL mask has an effect similar to that of blowing one or more fuses or antifuses in the chip. In particular, the alteration made to the BEOL mask data disconnects the defective circuit block of the subsequently manufactured chip from other BEOL elements. Alternatively, the alteration to the BEOL mask data "fences", e.g., takes offline the defective FEOL element. In a particular embodiment, the alteration made to the BEOL design data has an effect of replacing the defective circuit block with a redundancy circuit block in the subsequently manufactured chip. Since the status of defects in the FEOL mask is known at this time, the redundancy replacement of the circuit block can be performed with a redundancy circuit block for which the FEOL mask data are without defect.

After all alterations, e.g., deletions and severing operations have been performed to the BEOL mask at the design data stage, in step 260 the BEOL mask is fabricated using the corrected BEOL mask design data. Thereupon, the resulting BEOL mask is a corrected one, having features which produce corrected BEOL elements on the chip. As discussed above, the corrected BEOL elements of the chip have the effect of disconnecting certain circuit blocks, circuits or circuit elements from others and/or connecting other circuit blocks, circuits or circuit elements, e.g., redundancy elements in their place. In such way, the corrected BEOL mask compensates for defects in the FEOL mask by assuring that the chip produced by the set of FEOL and BEOL masks will be free of failures due to known FEOL mask defects.

Moreover, with the ability to alter the BEOL mask to correct for defects in the FEOL mask in accordance with this embodiment, there is no longer a need to produce a defect-free FEOL mask. Rather, the ability to correct for such defects by altering the BEOL mask now permits the FEOL mask to be produced with a tolerance for a certain number and/or certain type of defects.

Figure 3:
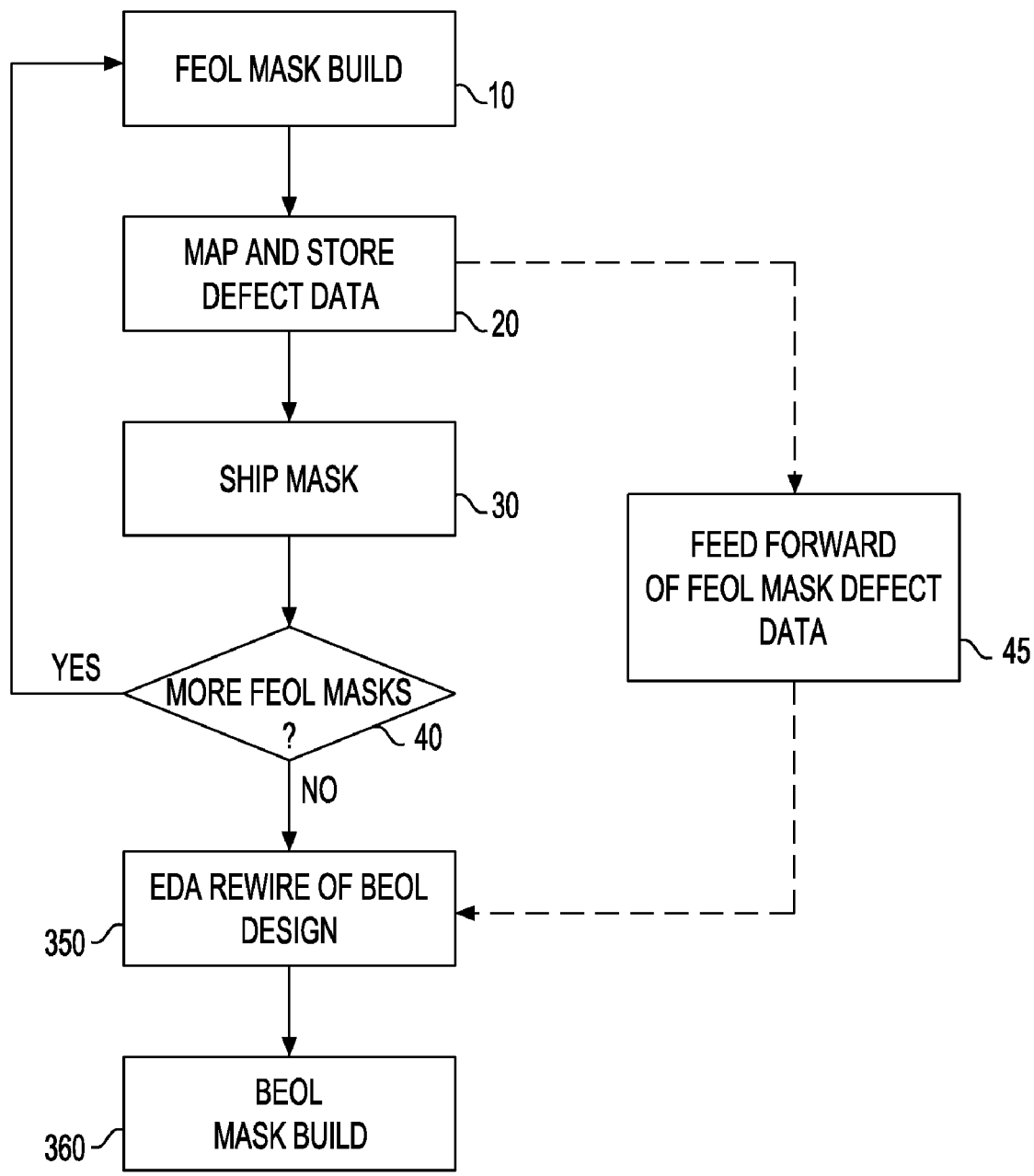
FIG. 3 is a diagram illustrating a method of fabricating of set of masks in a method of patterning a substrate in accordance with a variation of the second embodiment of the invention.

FIG. 3 illustrates a method of producing first and second sequentially subsequent masks similar to that described above with reference to FIG. 2. Once again, the process illustrated in FIG. 3 will be described with reference to patterning a substrate using an FEOL mask and a BEOL mask, with the understanding that the principles and operations illustrated therein can be applied to patterning a substrate initially using one or more masks and thereafter using a sequentially subsequent mask to continue patterning the substrate thereafter. Referring to FIG. 3, the steps performed initially with respect to blocks 10, 20, 30, 40 and 45 are the same as those shown and described above with reference to FIG. 2. This embodiment differs from that illustrated in FIG. 2 in that the alterations made to the second mask, i.e., to the BEOL mask in this exemplary embodiment are not limited to deletions and severing of features to produce changes similar to the blowing of fuses and/or antifuses. Instead, with the FEOL mask defect data, in step 350 the design of the BEOL mask is altered, i.e. corrected by "rewiring". Such rewiring is performed in a way not limited to the isolation, i.e., removal of one or more defective elements and replacement with one or more redundancy elements. For example, when a defect in the FEOL mask affects a relatively large portion of a chip, the remedy can be to change the BEOL mask design to correct for that. For example, assume that the syndrome resulting from the FEOL mask defect is elevated FEOL device capacitance. Increased capacitance is usually unwanted because it makes FEOL devices, e.g., transistors, diodes, etc., swing more slowly between signal levels. When such defect is present in the FEOL mask, one remedy performed at block 350 can be to alter the wiring of the chip at the design stage of the BEOL mask to compensate for the increased capacitance. In a specific example, such remedy may be to change the quantity, lengths and/or cross-sectional areas of BEOL wiring elements as represented on the mask in a way to compensate for the FEOL mask defect. In such way, an FEOL mask that could not be used before because of defects can be made usable to produce a chip which functions acceptably.

Figure 4:
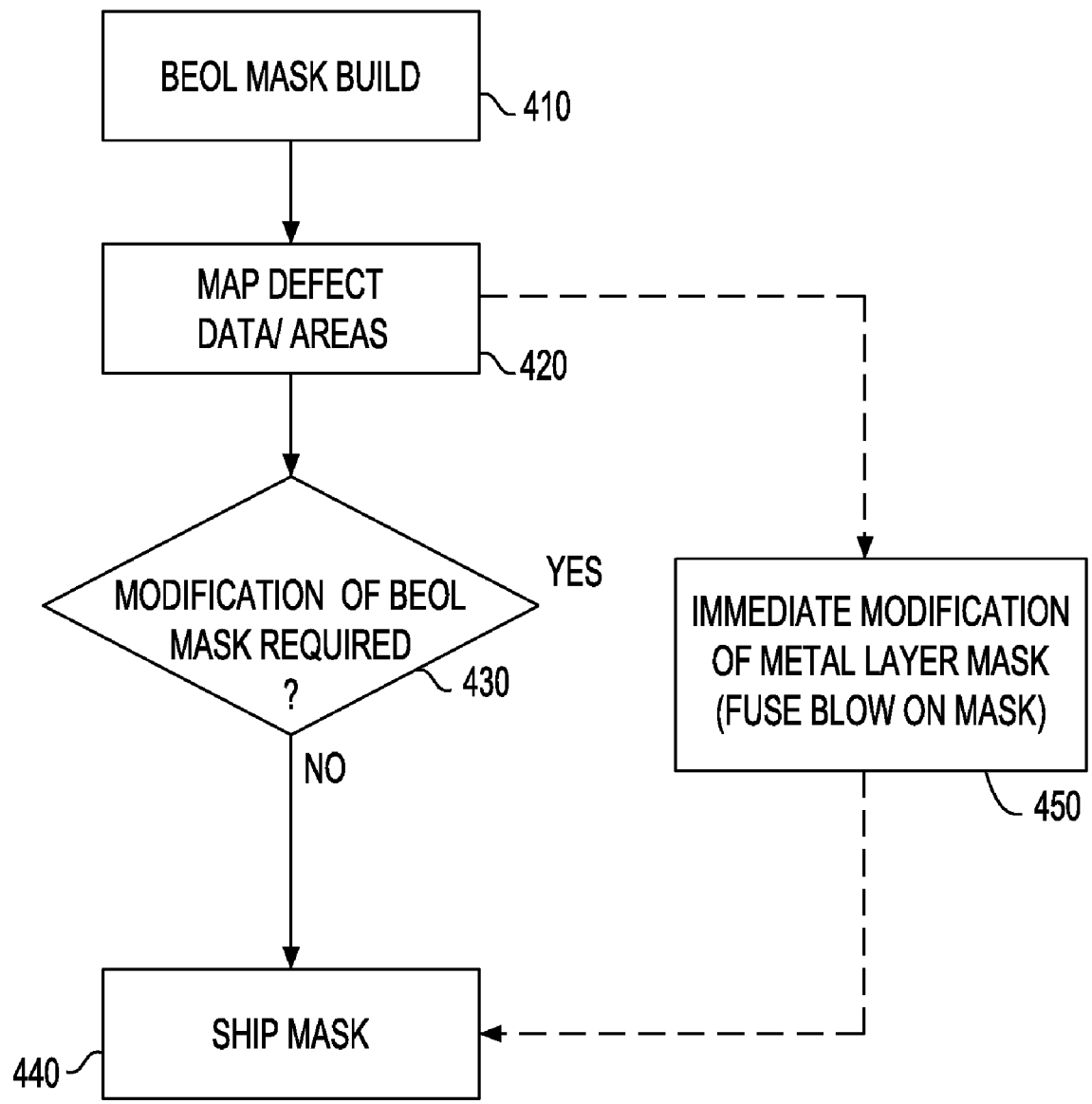
FIG. 4 is a diagram illustrating a method of fabricating a mask in a method of patterning a substrate in accordance with a third embodiment of the invention.

FIG. 4 illustrates a variation of the embodiment described above with respect to FIG. 1, as applied to the fabrication of a mask. In a particular example, the mask is a BEOL mask. However the method of fabricating a mask described here is not limited only the fabrication of a BEOL mask. Rather, the method can be applied to the fabrication of any type of mask used at any stage of processing the substrate.

Similar to that shown in FIG. 1, in block 410 the BEOL mask is built. In block 420, an image is made of the mask for inspection purposes. Using such image, areas of the mask are checked for conformity to patterns and tolerances, with the result of producing a set of BEOL mask data representing any defects found during the process. As in the embodiment illustrated above with respect to FIG. 1, the locations of the defects are mapped. Then, as further illustrated with respect to blocks 430 and 450, defects in the BEOL mask are corrected by immediate changes made thereto. Specifically, in block 430 it is determined whether the BEOL mask data indicates a defect, and if so, whether such defect is remediable by modifying the mask. If the BEOL mask data do not indicate presence of a defect, then the mask is shipped, i.e., released for use in manufacturing chips, as indicated at block 440. However, when the BEOL mask data identifies a defect and such defect is remediable, then the process according to block 450 is performed.

With respect to such block 450, in this embodiment certain discrete features of the BEOL mask can added, removed or severed after the mask is fabricated, such as by deletion of a patterned feature from the BEOL mask. For example, when the mask is one which includes a plurality of opaque features on a transparent substrate, one or more of the opaque features is deleted, as by any of several known methods for altering masks, e.g., controlled spot illumination via a laser. Alternatively, additional masking features can be created by selective deposition of opaque material or other known techniques.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of patterning a substrate, comprising:

fabricating a first mask, said first mask including a plurality of first features usable to pattern a plurality of regular elements and a plurality of redundancy elements of at least one of a microelectronic substrate or micro-electromechanical substrate;

testing said first mask to detect one or more defects in said plurality of first features;

fabricating a second mask, said second mask including a plurality of second features usable to pattern a plurality of interconnections, said plurality of interconnections including interconnections between individual ones of said plurality of regular elements and interconnections between said plurality of regular elements and said plurality of redundancy elements;

patterning said regular elements and said redundancy elements of said substrate using said first mask;

patterning said plurality of interconnections of said substrate using said second mask; and altering said plurality of interconnections of said substrate to correct for said detected defects in said first mask.

2. The method of patterning a substrate as claimed in claim 1, wherein said step of altering said plurality of interconnections includes at least either breaking one or more of said interconnections between ones of said plurality of regular elements or establishing one or more of said interconnections between said plurality of regular elements and said plurality of redundancy elements.

3. The method of patterning a substrate as claimed in claim 1, further comprising testing said substrate to identify defects in said plurality of regular elements and said plurality of redundancy elements, wherein said step of altering said plurality of interconnections of said substrate is performed before beginning to test said substrate to identify defects in said plurality of regular elements or in said plurality of redundancy elements.

4. The method of patterning a substrate as claimed in claim 3, further comprising: further altering said plurality of interconnections of said substrate to correct for said detected defects in said plurality of regular elements and said plurality of redundancy elements.

5. The method of patterning a substrate as claimed in claim 1, wherein said step of testing said first mask is performed prior to said step of patterning said regular elements and said redundancy elements of said substrate, said step of testing said first mask further comprising identifying one or more types and one or more locations of said defects in said first mask, and said step of altering said plurality of interconnections is performed using said identified types and said identified locations of said detected defects.

6. The method of patterning a substrate as claimed in claim 1, wherein said first mask is a front-end-of-line ("FEOL") mask and said plurality of first features of includes a plurality of FEOL features and said second mask is a back-end-of-line ("BEOL") mask, and said plurality of second features includes a plurality of BEOL features.

7. A method of patterning a substrate, comprising:

fabricating a first mask, said first mask including a plurality of first features usable to pattern a plurality of regular elements and a plurality of redundancy elements of at least one of a microelectronic substrate or micro-electromechanical substrate;

testing said first mask to detect one or more defects in said plurality of first features and to generate first mask defect data identifying said one or more detected defects;

providing a digital representation of a second mask usable in sequence after using said first mask, said second mask having a plurality of second features usable to pattern a plurality of interconnections on said substrate, said plurality of interconnections including interconnections between individual ones of said plurality of regular elements and interconnections between said plurality of regular elements and said plurality of redundancy elements;

using said first mask defect data, altering one or more of said plurality of second features of said digital representation to produce a digital representation of a corrected second mask which compensates for said one or more defects in said first mask;

fabricating said corrected second mask from said digital representation thereof;

patterning said regular elements and said redundancy elements of said substrate using said first mask; and patterning said plurality of interconnections of said substrate using said corrected second mask, whereby said plurality of interconnections patterned according to said corrected second mask correct for said detected defects in said first mask.

8. The method of patterning a substrate according to claim 7, wherein said step of altering said one or more features of said digital representation of said second mask includes identifying one or more discrete elements patternable on said substrate with said mask, said one or more discrete elements being at least one of deletable or addable to said mask to correct said plurality of interconnections on said substrate and at least one of deleting or adding said one or more discrete elements from said digital representation.

9. The method of patterning a substrate according to claim 8, wherein said one or more features of said digital representation of said second mask include one or more elements selected from the group consisting of fuses and antifuses.

10. The method of patterning a substrate according to claim 7, wherein said step of altering said one or more features of said digital representation of said second mask further includes redesigning a multiplicity of features of said second mask usable to pattern a multiplicity of said plurality of interconnections on said substrate.

11. The method of patterning a substrate according to claim 7, wherein said defects in said first mask include defects affecting a group of said features of said FEOL mask and said multiplicity of features of said second mask are redesigned as a group to compensate for said defects affecting said group of said features.

12. The method of patterning a substrate as claimed in claim 7, wherein said first mask is a front-end-of-line ("FEOL") mask and said plurality of first features of includes a plurality of FEOL features and said second mask is a back-end-of-line ("BEOL") mask, and said plurality of second features includes a plurality of BEOL features.

13. A method of patterning a substrate, comprising:
fabricating a mask, said mask including a plurality of first features usable to pattern a plurality of first elements of at least one of a microelectronic substrate or a microelectromechanical substrate;

testing said mask to detect one or more defects in said plurality of first features and to generate first mask defect data identifying said one or more detected defects;

altering one or more of said plurality of first features to produce a corrected mask; and patterning said plurality of first elements of said substrate using said corrected mask.

14. The method of patterning a substrate as claimed in claim 13, wherein said step of altering said one or more first features includes deleting one or more discrete features of said plurality of first features from said mask.

15. The method of patterning a substrate as claimed in claim 13, wherein said step of altering said one or more first features includes severing one or more discrete features of said plurality of first features from said mask.

16. The method of patterning a substrate as claimed in claim 13, wherein said step of altering said one or more first features includes focusing a laser onto a spot illuminating said one or more discrete features of said plurality of first features.

17. The method of patterning a substrate as claimed in claim 13, wherein said plurality of first features includes a plurality of back-end-of-line ("BEOL") features and said step of patterning said plurality of BEOL features is performed after patterning a plurality of elements of said substrate using an FEOL mask, said FEOL mask including one or more defects, said one or more defects being compensated by alterations made to said plurality of BEOL features of said BEOL mask.

18. The method of patterning a substrate as claimed in claim 13, wherein said mask is a front-end-of-line ("FEOL") mask and said plurality of first features of includes a plurality of FEOL features.

* * * * *